(12) United States Patent
Colombeau et al.

(10) Patent No.: US 12,538,509 B2
(45) Date of Patent: Jan. 27, 2026

(54) GATE-ALL-AROUND TRANSISTORS AND METHODS OF FORMING

(71) Applicant: Applied Materials, Inc., Santa Clara, CA (US)

(72) Inventors: Benjamin Colombeau, San Jose, CA (US); Balasubramanian Pranatharthiharan, San Jose, CA (US); Lequn Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 559 days.

(21) Appl. No.: 17/967,099

(22) Filed: Oct. 17, 2022

(65) Prior Publication Data
US 2023/0178628 A1  Jun. 8, 2023

Related U.S. Application Data

(60) Provisional application No. 63/285,276, filed on Dec. 2, 2021.

(51) Int. Cl.
*H10D 30/01* (2025.01)
*H01L 21/02* (2006.01)
(Continued)

(52) U.S. Cl.
CPC ..... *H10D 30/014* (2025.01); *H01L 21/02532* (2013.01); *H01L 21/02603* (2013.01);
(Continued)

(58) Field of Classification Search
CPC .......... H01L 21/02603; H10D 30/6735; H10D 62/118
See application file for complete search history.

(56) References Cited

U.S. PATENT DOCUMENTS

| 2015/0255507 A1 | 9/2015 | Pakala |
| 2017/0271477 A1 | 9/2017 | Palle |

(Continued)

FOREIGN PATENT DOCUMENTS

| KR | 1020060037776 A | 5/2006 |
| KR | 1020160136290 A | 11/2016 |

(Continued)

OTHER PUBLICATIONS

International Search Report and Written Opinion for the International Patent Application No. PCT/US2022/048313, mailed Mar. 2, 2023, 9 pages.

*Primary Examiner* — Brian Turner
(74) *Attorney, Agent, or Firm* — KDW Firm PLLC

(57) ABSTRACT

Approaches herein provide devices and methods for forming optimized gate-all-around transistors. One method may include forming a plurality of nanosheets each comprising a plurality of alternating first layers and second layers, and etching the plurality of nanosheets to laterally recess the second layers relative to the first layers. The method may further include forming an inner spacer over the recessed second layers by forming a spacer material along an exposed portion of each of the plurality of nanosheets, etching the spacer material to remove the spacer material from the first layers of each of the plurality of nanosheets, and performing a sidewall treatment to the plurality of nanosheets after the spacer material is removed from the first layers of each of the plurality of nanosheets.

14 Claims, 17 Drawing Sheets

(51) Int. Cl.
    *H01L 21/306* (2006.01)
    *H01L 21/66* (2006.01)
    *H10D 30/43* (2025.01)
    *H10D 30/67* (2025.01)
    *H10D 62/10* (2025.01)
    *H10D 64/01* (2025.01)

(52) U.S. Cl.
    CPC ........ *H01L 21/30604* (2013.01); *H01L 22/12* (2013.01); *H10D 30/031* (2025.01); *H10D 30/43* (2025.01); *H10D 30/6735* (2025.01); *H10D 62/121* (2025.01); *H10D 64/015* (2025.01); *H10D 64/017* (2025.01); *H10D 64/018* (2025.01)

(56) References Cited

U.S. PATENT DOCUMENTS

| | | |
|---|---|---|
| 2018/0122900 A1 | 5/2018 | Cheng |
| 2018/0301341 A1* | 10/2018 | Coquand ........... H01L 21/28518 |
| 2018/0301531 A1* | 10/2018 | Xie ...................... H10D 62/235 |
| 2019/0019681 A1 | 1/2019 | Wong |
| 2019/0109052 A1 | 4/2019 | Reznicek |
| 2019/0341450 A1* | 11/2019 | Lee ................... H01L 21/02532 |
| 2020/0287021 A1 | 9/2020 | Wu |
| 2021/0126106 A1 | 4/2021 | Wang |
| 2021/0126135 A1 | 4/2021 | Lee |
| 2021/0335657 A1 | 10/2021 | Lu |
| 2021/0367032 A1 | 11/2021 | Chen |
| 2023/0054701 A1* | 2/2023 | Xie ........................ H10D 30/43 |
| 2023/0067331 A1 | 3/2023 | Pal |

FOREIGN PATENT DOCUMENTS

| | | |
|---|---|---|
| KR | 1020210109412 A | 9/2021 |
| TW | 202125597 A | 7/2021 |
| TW | 202145569 A | 12/2021 |
| WO | 2015147792 A1 | 10/2015 |

* cited by examiner

GATE-ALL-AROUND TRANSISTORS AND METHODS OF FORMING

RELATED APPLICATION

This present application claims priority to U.S. provisional patent application Ser. No. 63/285,276, filed on Dec. 2, 2021, entitled "GATE-ALL-AROUND TRANSISTORS AND METHODS OF FORMING," which is incorporated herein by reference in its entirety.

FIELD OF THE DISCLOSURE

The present embodiments relate to semiconductor device patterning, and more particularly, to devices and techniques for forming optimized gate-all-around transistors.

BACKGROUND OF THE DISCLOSURE

As integrated circuit (IC) technologies progress towards smaller technology nodes, multi-gate devices have been used to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors, both also referred to as non-planar transistors, are examples of multi-gate devices that provide high performance and low leakage applications. GAA transistors typically have a gate structure that can extend, partially or fully, around a channel region to provide access to the channel region on two or more sides. The channel region of GAA transistors may be formed from nanowires, nanosheets, or other nano structures.

Successful integration of different multi-gate devices, including nanowire and/or nanosheet transistors, on one integrated circuit, is challenging. For example, lateral etch rate differences, e.g., due to polysilicon crystallization orientation, results in rough, sloped, and/or non-uniform sidewall surfaces, which leads to vertical profile distortion. As processing continues, a conformal spacer subsequently formed over the non-uniform sidewall surfaces inherits the profile distortion, leading to inconsistent gate length patterning.

Accordingly, improved approaches are needed to control gate length variation during processing.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a plurality of nanosheets each comprising a plurality of alternating first layers and second layers, and etching the plurality of nanosheets to laterally recess the second layers relative to the first layers. The method may further include forming an inner spacer over the recessed second layers by forming a spacer material along an exposed portion of each of the plurality of nanosheets, etching the spacer material to remove the spacer material from the first layers of each of the plurality of nanosheets, and performing a sidewall treatment to the plurality of nanosheets after the spacer material is removed from the first layers of each of the plurality of nanosheets.

In another aspect, a system may include a processor and a memory storing instructions executable by the processor to form a plurality of nanosheets each comprising a plurality of alternating first layers and second layers, etch the plurality of nanosheets to laterally recess the second layers relative to the first layers, and form an inner spacer over the recessed second layers by performing the following: forming a spacer material along an exposed portion of each of the plurality of nanosheets, etching the spacer material to remove the spacer material from the first layers of each of the plurality of nanosheets, and performing a sidewall treatment to the plurality of nanosheets after the spacer material is removed from the first layers of each of the plurality of nanosheets.

In yet another aspect, a device may include a plurality of dummy gates over a plurality of nanosheets, wherein each of the plurality of nanosheets comprises alternating first layers and second layers, wherein the plurality of nanosheets extend in a vertical direction from a substrate base, and wherein a first thickness of the second layers, in a horizontal direction, is less than a second thickness of the first layers, in the horizontal direction, and an inner spacer formed just along the second layers.

BRIEF DESCRIPTION OF THE DRAWINGS

The accompanying drawings illustrate exemplary approaches of the disclosure, including the practical application of the principles thereof, as follows.

Figure 1:
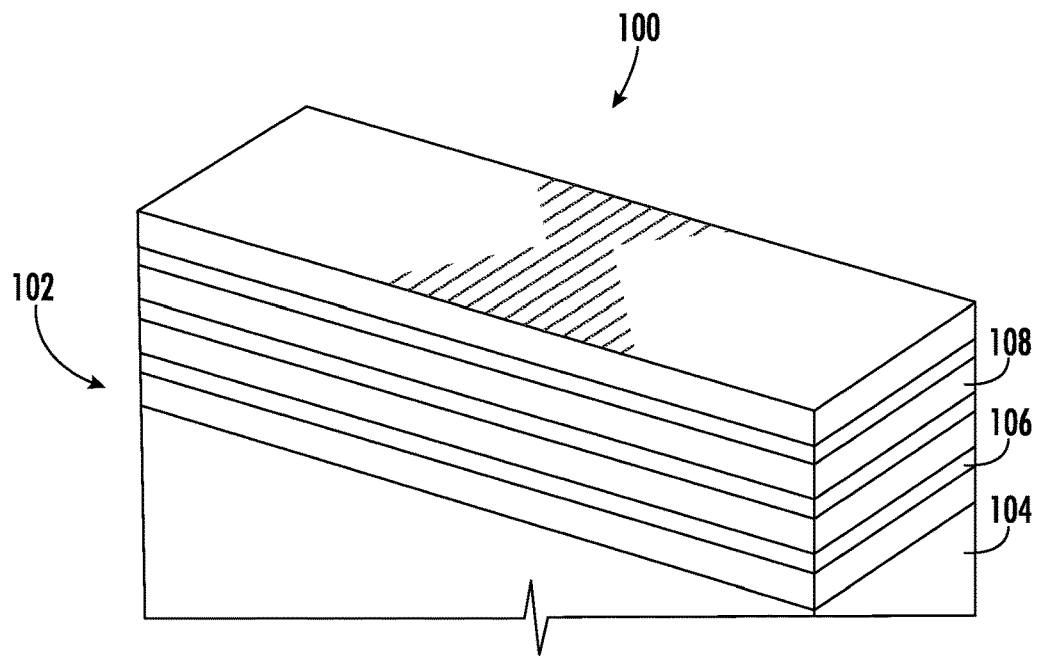
FIG. 1 illustrates a perspective view of a substrate of an exemplary device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously reduce dummy gate CD variation and improve nanosheet gate length uniformity by laterally etching a first layer type of a set of nanosheets of a gate-all-around (GAA) transistor relative to a second layer type. An inner spacer may then be formed over the first layer type prior to source/drain (S/D) epi formation. In some embodiments, a sidewall treatment may be performed on the inner spacer prior to S/D epi formation. By doing so, an optimized gate-all-around (GAA) transistor may be formed.

FIG. 1 illustrates a perspective view of a semiconductor device (hereinafter "device") 100 at an early stage of processing, according to one or more embodiments described herein. The device 100 may be a GAA device structure, a vertical GAA device structure, a horizontal GAA device structure, or a nanosheet field effect transistor (FinFET) device structure. As shown, the device 100 may include a nanosheet stack 102 including a substrate base 104 and a plurality of alternating first layers 106 and second layers 108 formed over the substrate base 104. In various embodiments, the plurality of alternating first layers 106 and second layers 108 may include two to ten first layers 106 and two to ten second layers 108. A composition of the first layers 106 may be different than a composition of the second layers 108 to achieve etching selectivity and/or different oxidation rates during subsequent processing, for example. In some embodiments, the plurality of alternating first layers 106 and second layers 108 may include different materials, different constituent atomic percentages, different constituent weight percentages, and/or other different characteristics to achieve desired etching selectivity.

In the present embodiment, the first layers 106 may include silicon (Si) and the second layers 108 may include silicon germanium (SiGe), which has a different etch selectivity than silicon. Although non-limiting, a thickness of each first layer 106 may be about 1 nm to about 10 nm, a thickness of each second layer 108 may be about 1 nm to about 10 nm, and the two thicknesses can be the same or different. Although non-limiting, the plurality of alternating first layers 106 and second layers 108 may be epitaxially grown in the depicted interleaving and alternating configuration, layer-by-layer, until a desired number of semiconductor layers is reached.

Figure 2:
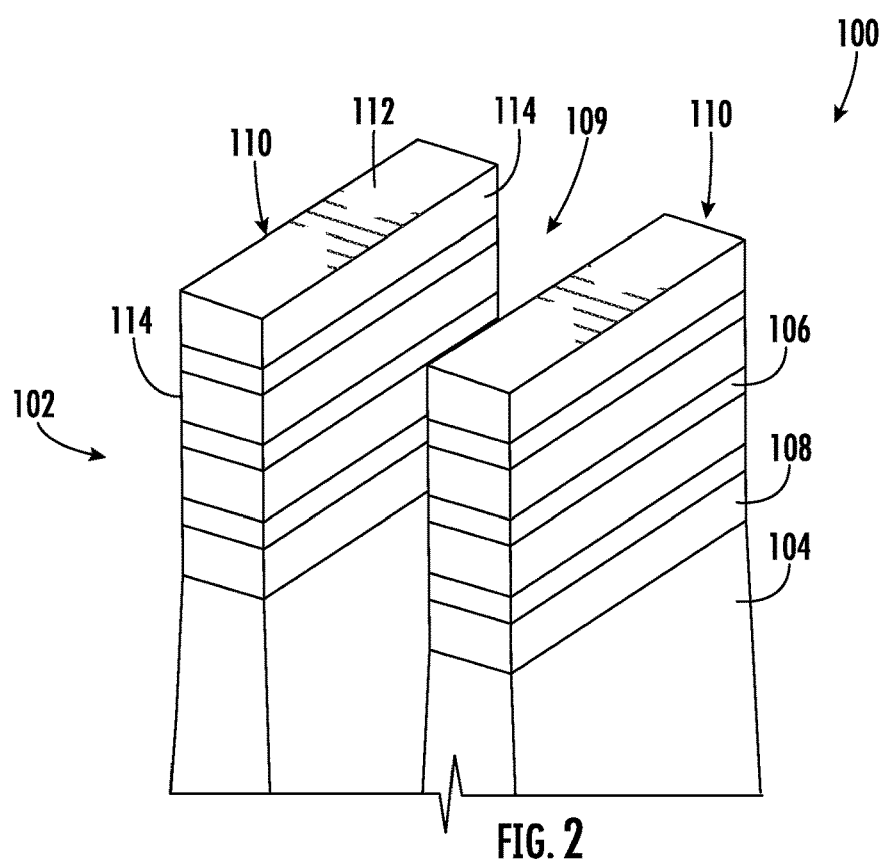
FIG. 2 illustrates a perspective view of a pair of nanosheet structures formed from the substrate of the device, according to embodiments of the present disclosure.

As shown in FIG. 2, the nanosheet stack 102 may be processed (e.g., etched) to form a plurality of structures, or nanosheets 110, extending in a vertical direction from the substrate base 104. Each of the nanosheets 110 may include an upper surface 112 and a set of opposing sidewall surfaces 114. Adjacent nanosheets 110 may be separated by a trench 109. The nanosheets 110 may be patterned by any suitable method. For example, the nanosheets 110 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Embodiments herein are not limited in this context.

Figure 3:
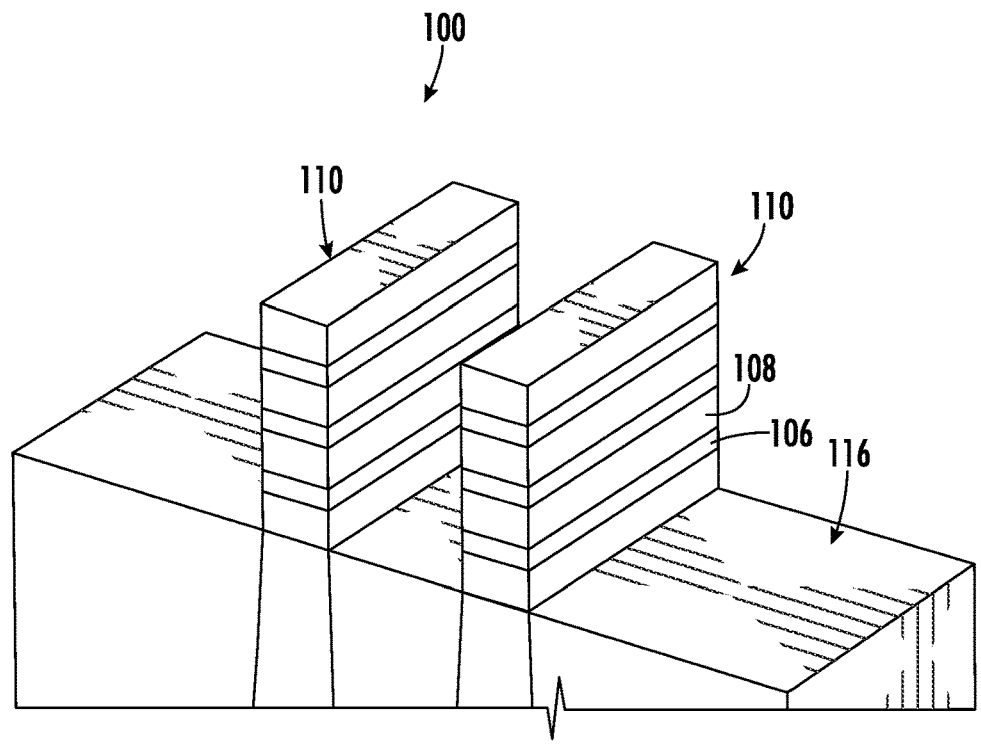
FIG. 3 illustrates a perspective view of a source trench isolation (STI) layer of the device, according to embodiments of the present disclosure.

As shown in FIG. 3, a dielectric material is partially filled into the trench 109 (FIG. 2) to form a source trench isolation (STI) layer 116 between adjacent nanosheets 110. The STI layer 116 may comprise at least one of silicon oxide, silicon nitride, and carbon. The STI layer 116 may be deposited by any deposition method such as flowable CVD (FCVD), PECVD, PVD, ALD, and MOCVD.

Figure 4:
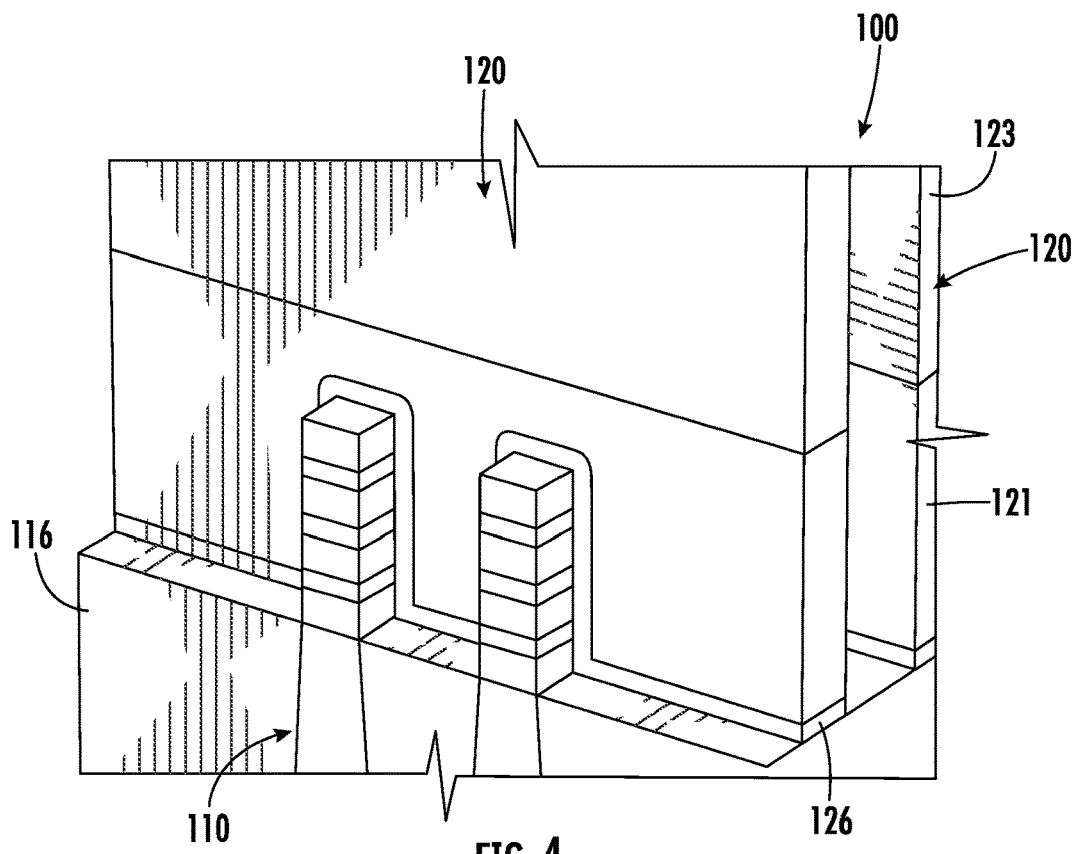
FIG. 4 illustrates a perspective view of a plurality of dummy gates formed over the pair of nanosheet structures of the device, according to embodiments of the present disclosure.

A plurality of dummy gate structures 120 may then be formed over the nanosheets 110, as shown in FIG. 4. The plurality of dummy gate structures 120 may be formed atop the STI layer 116. In some embodiments, the dummy gate structures 120 are sacrificial gates including a gate material layer 121 and a hardmask 123, wherein the gate material layer 121 may be formed atop an etch stop layer 126. In some embodiments, the gate material layer 121 may be an amorphous silicon (a-Si) or a polysilicon. The hardmask 123 may be conformally deposited over the gate material layer 121. As shown, the plurality of dummy gate structures 120 may have a lengthwise direction perpendicular to a lengthwise direction of the nanosheets 110.

Figure 5:
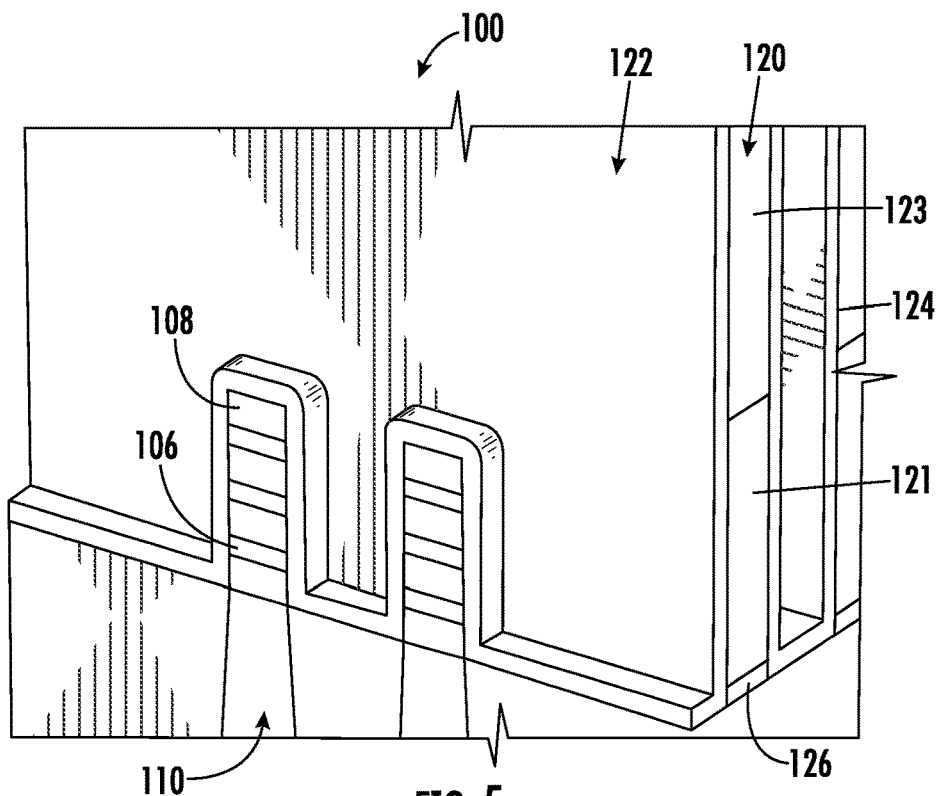
FIG. 5 illustrates a perspective view of spacer formed over the pair of nanosheet structures and over the plurality of dummy gate structures, according to embodiments of the present disclosure.
Figure 6:
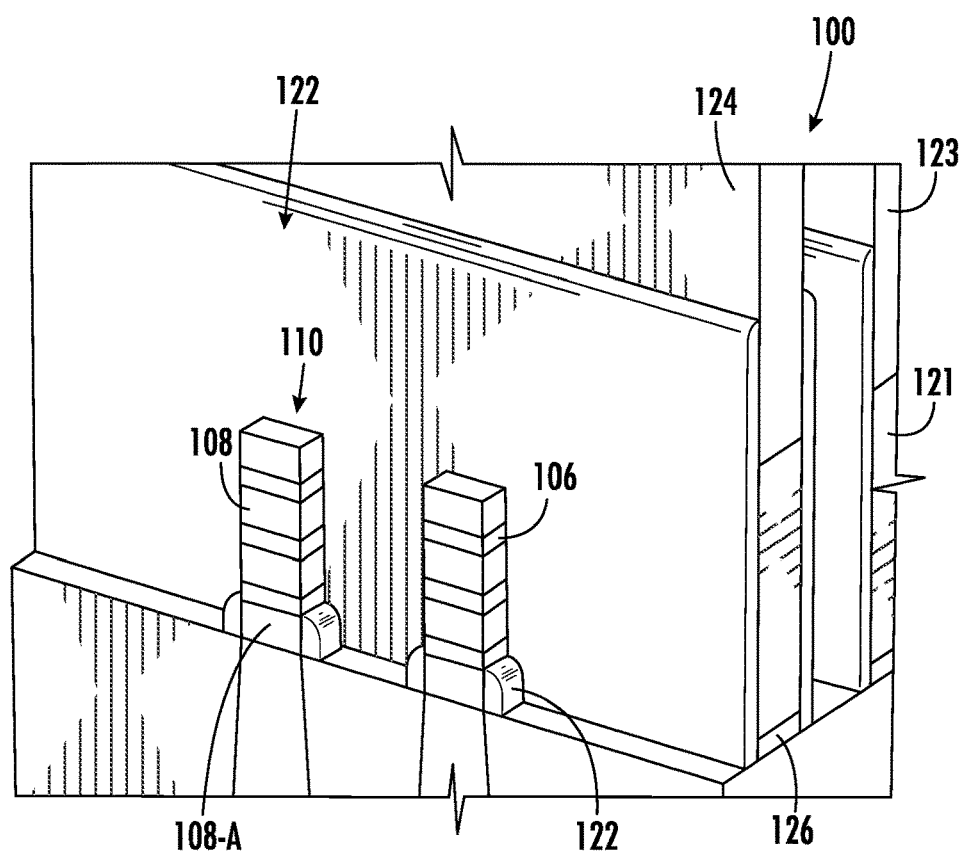
FIG. 6 illustrates a perspective view of the device following removal of the spacer from over the pair of nanosheet structures, according to embodiments of the present disclosure.

Next, as shown in FIG. 5, a plurality of gate spacers 122 may be formed over the device 100, including along a sidewall 124 of each of the dummy gates 120 and over the plurality of alternating first layers 106 and second layers 108 of the nanosheets 110. The gate spacers 122 may then be removed (e.g., etched), as demonstrated in FIG. 6, to expose a portion of the nanosheets 110, namely, the plurality of alternating first layers 106 and second layers 108. As shown, the gate spacers 122 may remain along a bottom layer 108-A of the second layers 108 of the nanosheets 110. Although non-limiting, the gate spacers 122 may be formed of a dielectric material such as silicon nitride, silicon oxide, silicon carbo-nitride, silicon oxynitride, silicon oxy carbonitride, or the like, and may have a single-layer structure or a multi-layer structure including a plurality of dielectric layers.

Figure 7A:
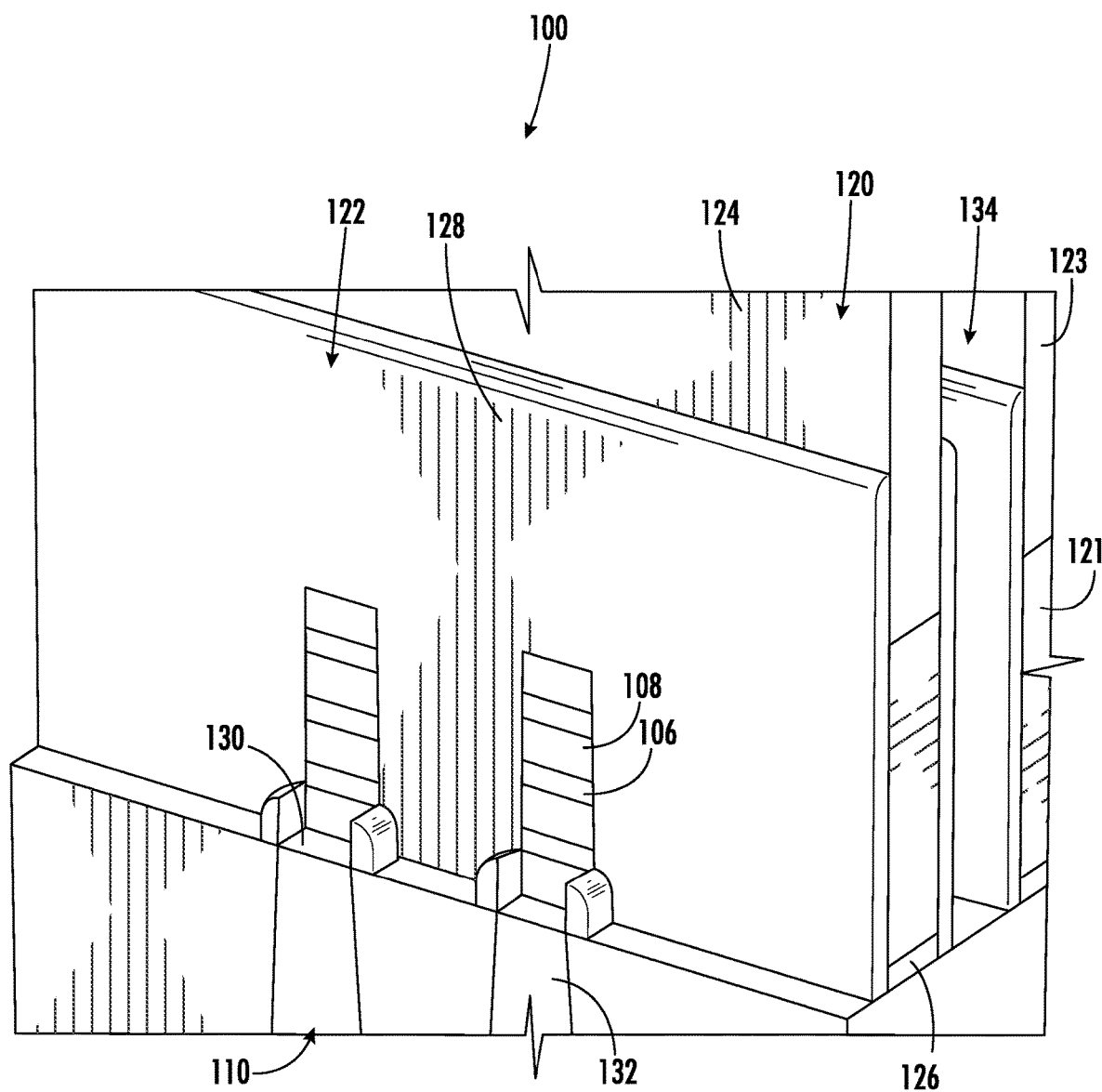
FIG. 7A illustrates a perspective view of the device following removal of a portion of the pair of nanosheet structures, according to embodiments of the present disclosure.
Figure 7B:
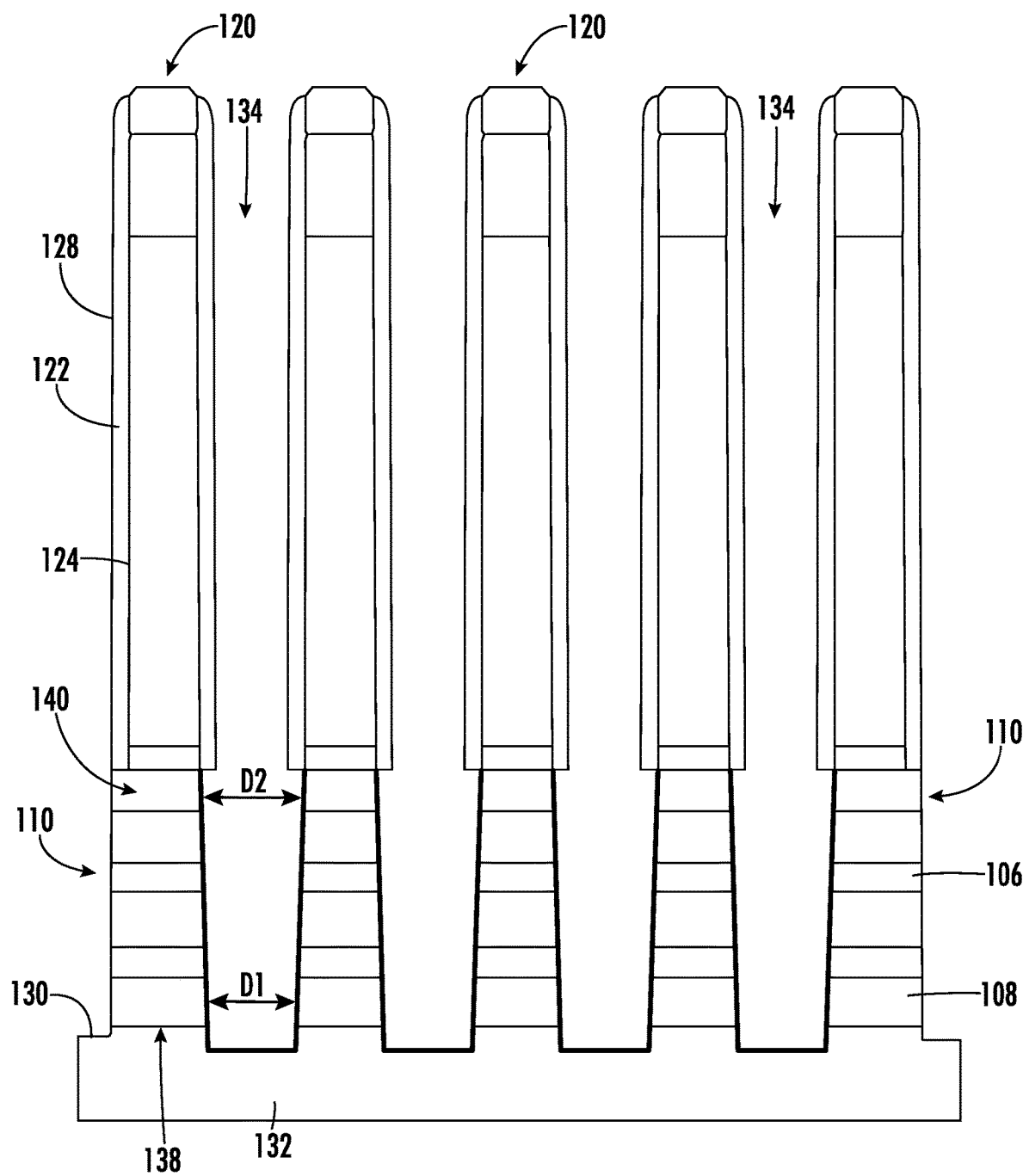
FIG. 7B illustrates a side cross-sectional view of the device following removal of the portion of the pair of nanosheet structures, according to embodiments of the present disclosure.

As shown in FIGS. 7A-7B, the exposed portions of the nanosheets 110 may then be removed. In some embodiments, the plurality of alternating first layers 106 and second layers 108 may be etched within trenches 134 selective to a plane defined by an outer surface 128 of the gate spacer 122 formed along the sidewalls 124 of the dummy gate structures 120. The plurality of alternating first layers 106 and second layers 108 may also be etched selective to an upper surface 130 of a silicon portion 132 of the nanosheets 110. As better shown in FIG. 7B, a first distance 'D1' between two adjacent nanosheets 110 along a lower portion 138 of the nanosheets 110 may be less than a second distance 'D2' along an upper portion 140 of the nanosheets 110 after the etch. Unless cured, this non-uniformity between sidewalls of the nanosheets 110 leads to vertical profile distortion.

Figure 8:
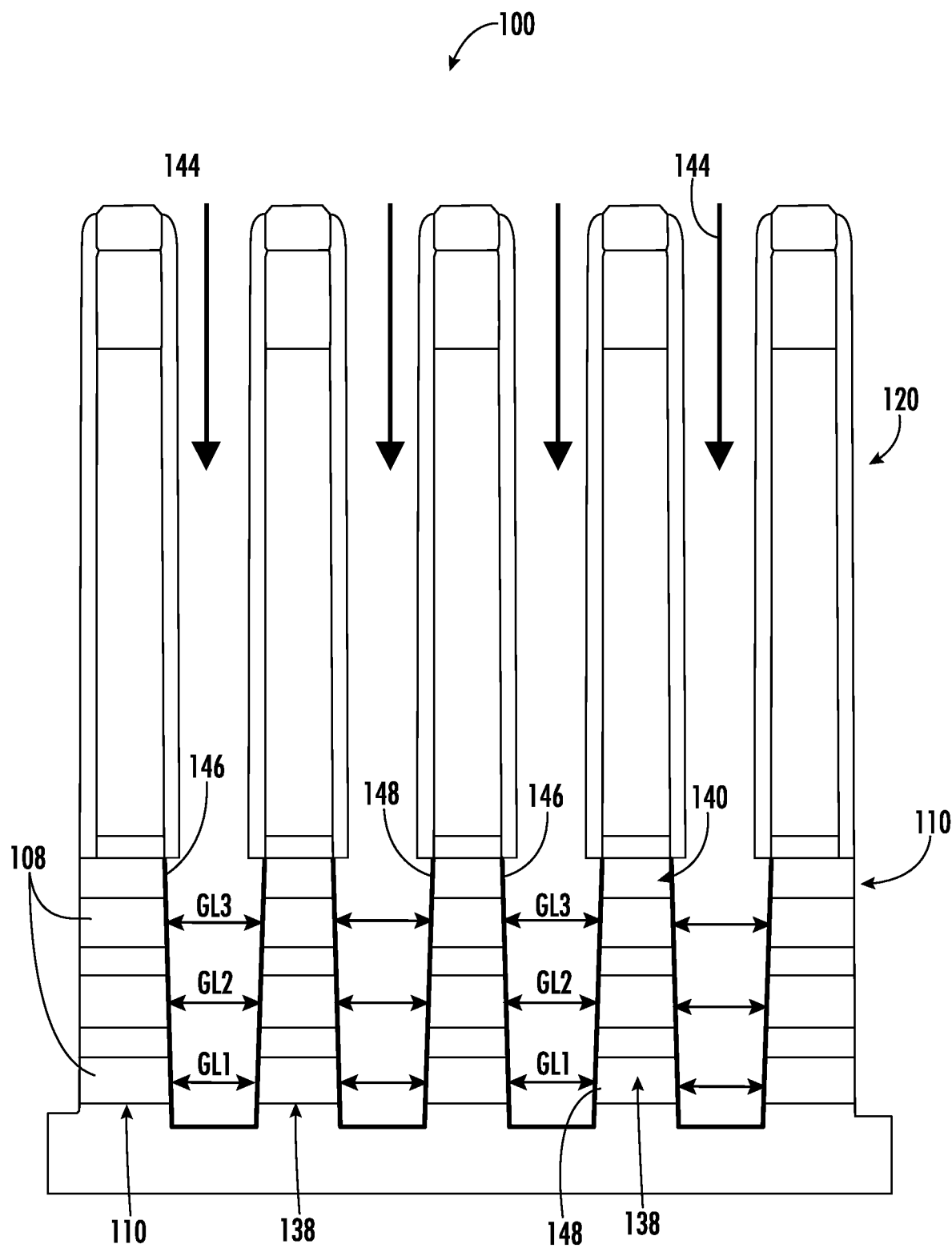
FIG. 8 illustrates a side cross-sectional view of the device during a measurement process, according to embodiments of the present disclosure.

To address this deficiency, a measurement process 144 may be performed on the device 100, as demonstrated in FIG. 8. The measurement process 144 may include taking a plurality of distance measurements (e.g., GL1, GL2, GL3) between a first sidewall 146 and a second sidewall 148 of the nanosheets 110, e.g., between the upper and lower portions 140, 138 thereof. More specifically, distance measurements GL1, GL2, GL3 may be taken along exposed sidewalls of the second layers 108. Due to etch process variations, GL3>GL2>GL1. It will be appreciated that a greater or lesser number of measurements may be taken between various points along the first sidewall 146 and the second sidewall 148.

In various embodiments, the measurement process 144 may include any number of different metrology techniques including, but not limited to, cross-section scanning electron microscopy (SEM), transmission electron microscopy (TEM), critical dimension scanning electron microscopy (CD-SEM) and the like. In other embodiments, an optical critical dimension (OCD) measurement, atomic force metrology (AFM), or critical dimension-atomic force metrology (CD-AFM) may be used for measuring gate lengths between the nano sheets 110. In some embodiments, the measurement process 144 may occur in a metrology chamber.

Data collected from the measurement process 144 may be used to determine a desired amount of lateral indentation for the second layers 108 and/or the first layers 106 to create a more uniform trench profile between the nanosheets 110. More specifically, it may be desirable for first and second distances D1, D2 (FIG. 7B) to be equal, or approximately equal. To accomplish this, GL1, GL2, GL3, etc., measurement data may be fed forward to an etch device, wherein an etch process/recipe is generated and executed based on the measurement data. In some embodiments, the etch process/recipe may be selected to target the specific material composition (e.g., SiGe) of the second layers 108, wherein the etch process may include one or multiple etch steps. For example, one or more etch steps may have high etching selectivity tuned to the second layers 108 with substantially no (or minimal) etching loss occurring on the first layers 106. In accordance with some embodiments of the present disclosure, the one or more etch steps may be include an anisotropic etching process using a variety of different gases.

Figure 9A:
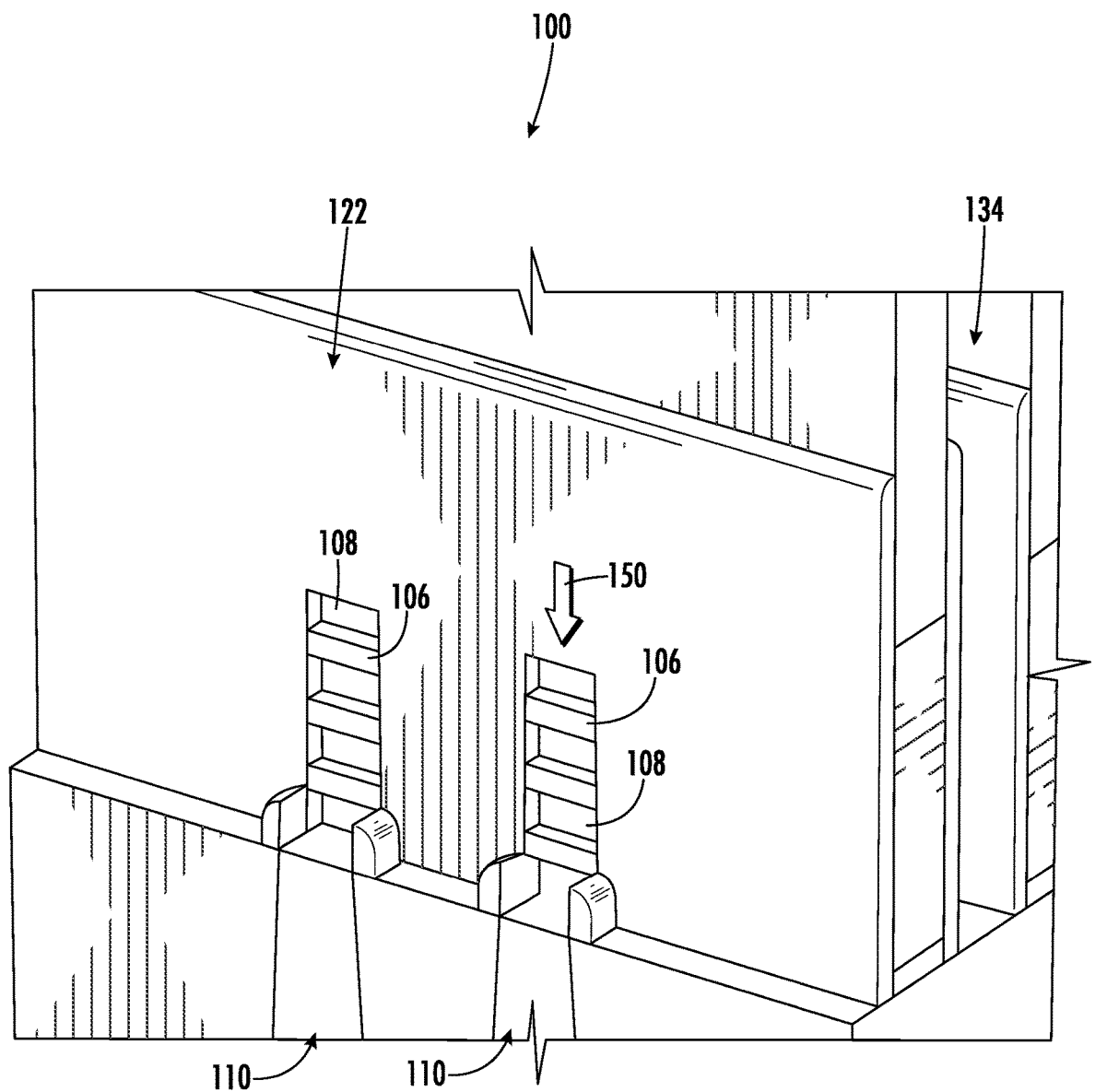
FIG. 9A illustrates a perspective view of the device following partial removal of a second layer of the pair of nanosheet structures, according to embodiments of the present disclosure.
Figure 9B:
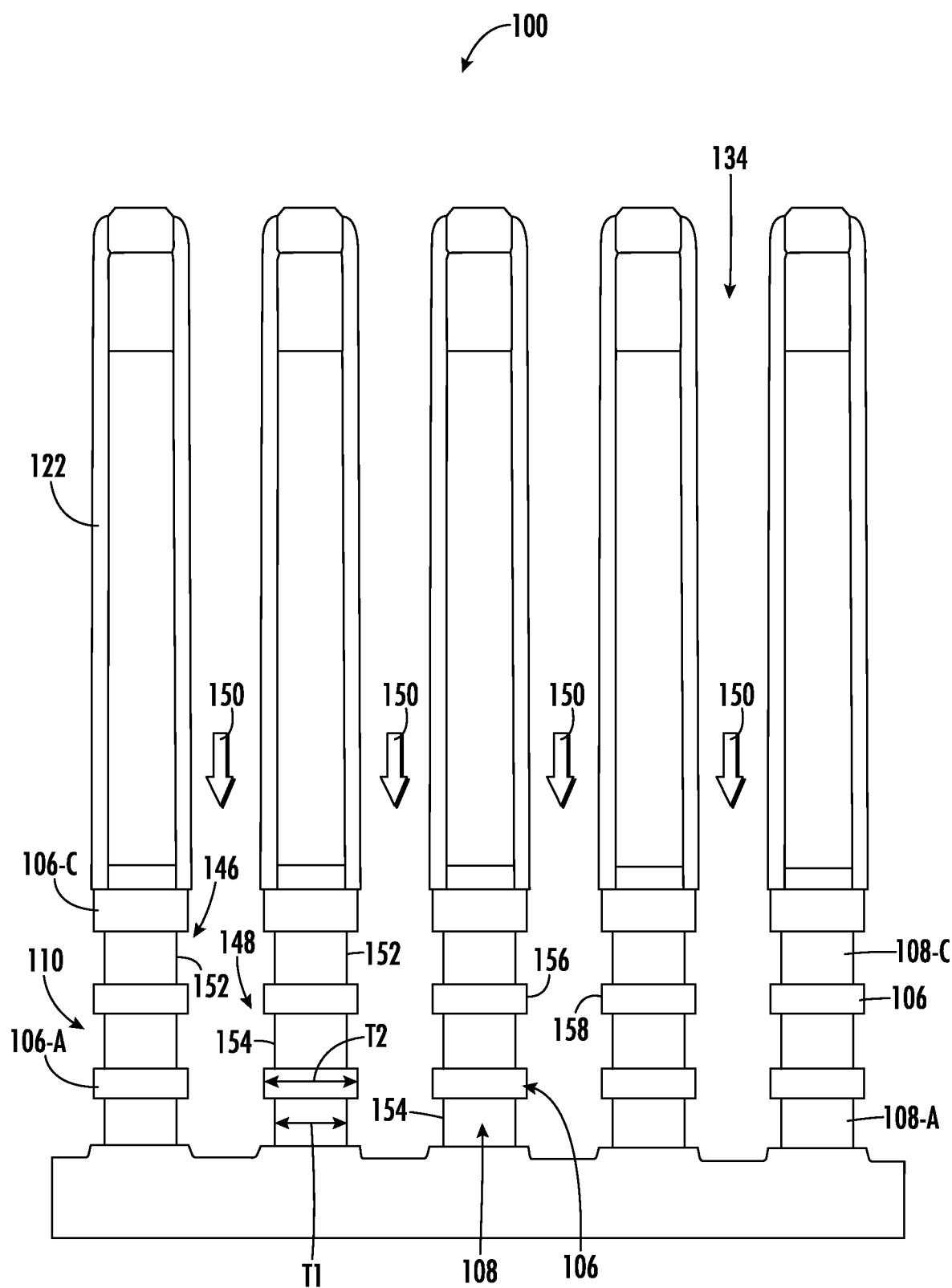
FIG. 9B illustrates a side cross-sectional view of the device following partial removal of the second layer of the pair of nanosheet structures, according to embodiments of the present disclosure.

As demonstrated in FIGS. 9A-9B, an etch process 150 may remove the second layers 108 relative to the first layers 106 of the nanosheets 110 and relative to the gate spacers 122. Although not shown, in some embodiments, the etch process 150 may be preceded by an initial etch operation to remove a portion of both the first and second layers 106, 108. For example, the first and second layers 106, 108 may be processed to create parallel sidewalls within each trench 134. In some embodiments, the etch process 150 may be a lateral SiGe etch performed by a selective rapid plasma etch (SRP) device with onboard metrology (OBM), optimized to indent the second layers 108 to a desired horizontal depth/distance, according to the etch process described above. Various etching parameters can be tuned to achieve selective etching of the second layers 108, such as etchant composition, etching temperature, etching solution concentration, etching time, etching pressure, source power, RF bias voltage, RF bias power, etchant flow rate, other suitable etching parameters, or combinations thereof. In some embodiments, the etch may be a selective isotropic dry etching process (e.g., a surface gas/radical reaction process) to the second layers 108 with a fluorine-containing gas (e.g., HF, $F_2$, $NF_3$, $CF_4$, $SF_6$, $CH_2F_2$, $CHF_3$, and/or $C_2F_6$). In some embodiments, a ratio of the fluorine-containing gas to an oxygen-containing gas (e.g., $O_2$), an etching temperature, and/or an RF power may be tuned to selectively etch the SiGe of the second layers 108.

As best shown in FIG. 9B, as a result of the lateral etch to the nanosheets 110, a first thickness 'T1' of the second layers 108, in a horizontal direction, is less than a second thickness 'T2' of the first layers 106, in the horizontal direction. In some embodiments, T1 of each of the second layers 108 may be equal, or approximately equal. In other embodiments, a thickness of the bottom layer 108-A of the second layers 108 may be greater than a thickness of an upper layer 108-C of the second layers 108. Furthermore, in some embodiments, T2 of each of the first layers 106 may be equal, or approximately equal. In other embodiments, a thickness of a bottom layer 106-A of the first layers 106 may be greater than a thickness of an upper layer 106-C of the first layers 106.

Following the etch process 150, the first and second sidewalls 146, 148 of the nanosheets 110 may be parallel, or approximately parallel, to one another. More specifically a plane defined by an outer surface 152 (FIG. 9B) of the second layers 108 of the first sidewall 146 may be approximately equal to a plane defined by an outer surface 154 of the second layers 108 of the second sidewall 148. Similarly, a plane defined by an outer surface 156 of the first layers 106 of the first sidewall 146 may be approximately equal to a plane defined by an outer surface 158 of the first layers 106 of the second sidewall 148.

Figure 10:
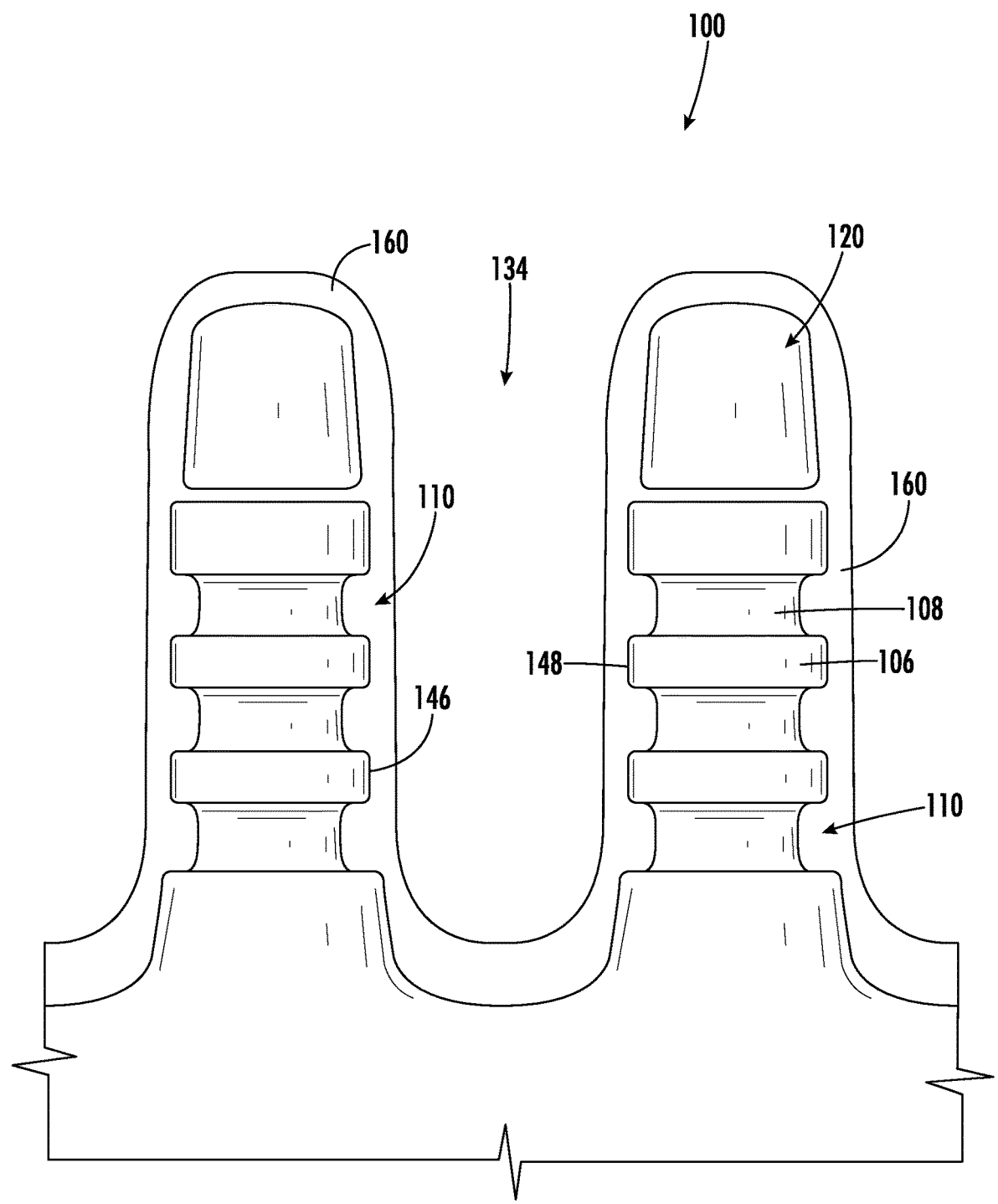
FIG. 10 illustrates a side cross-sectional view of the device including a spacer material formed over of the pair of nanosheet structures, according to embodiments of the present disclosure.

As shown in FIG. 10, a spacer material 160 may then be formed along the nanosheets 110. In some embodiments, the spacer material 160 may be a dielectric formed along the various exposed surfaces of the device 100, such as the dummy gate structures 120 and the surfaces of the plurality of alternating first layers 106 and second layers 108 exposed in the trenches 134. In some embodiments, the spacer material 160 may include a material that is different than materials in the first layers 106 and the gate spacers 122 (FIG. 9B) to achieve desired etching selectivity during subsequent etching processes. In some embodiments, the spacer material 160 includes a dielectric material, such as silicon, oxygen, carbon, nitrogen, other suitable material, or combinations thereof (e.g., silicon oxide, silicon nitride, silicon oxynitride, silicon carbide, or silicon oxycarbonitride). In some embodiments, the spacer material 160 includes a low-k dielectric material. Example low-k dielectric materials include fluoride-doped silica glass, carbon doped silicon oxide, Black Diamond® (Applied Materials of Santa Clara, Calif.), polyimide, other low-k dielectric material, or combinations thereof. Although non-limiting, the spacer material 160 may be formed via flowable chemical vapor deposition (FCVD) or atomic layer deposition (ALD).

Figure 11A:
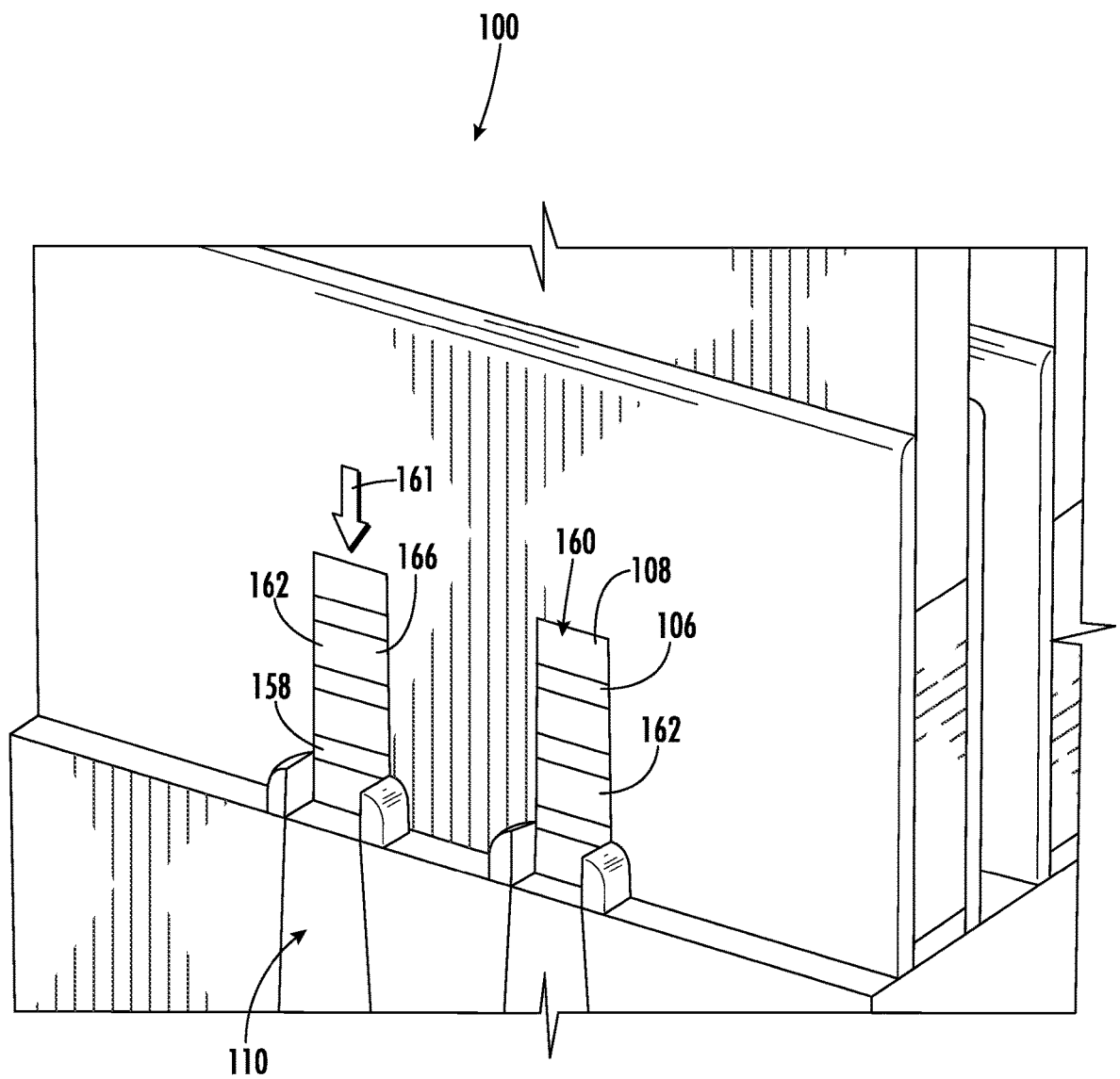
FIG. 11A illustrates a perspective view of the device following removal of the spacer material from over of a first layer of the pair of nanosheet structures, according to embodiments of the present disclosure.
Figure 11B:
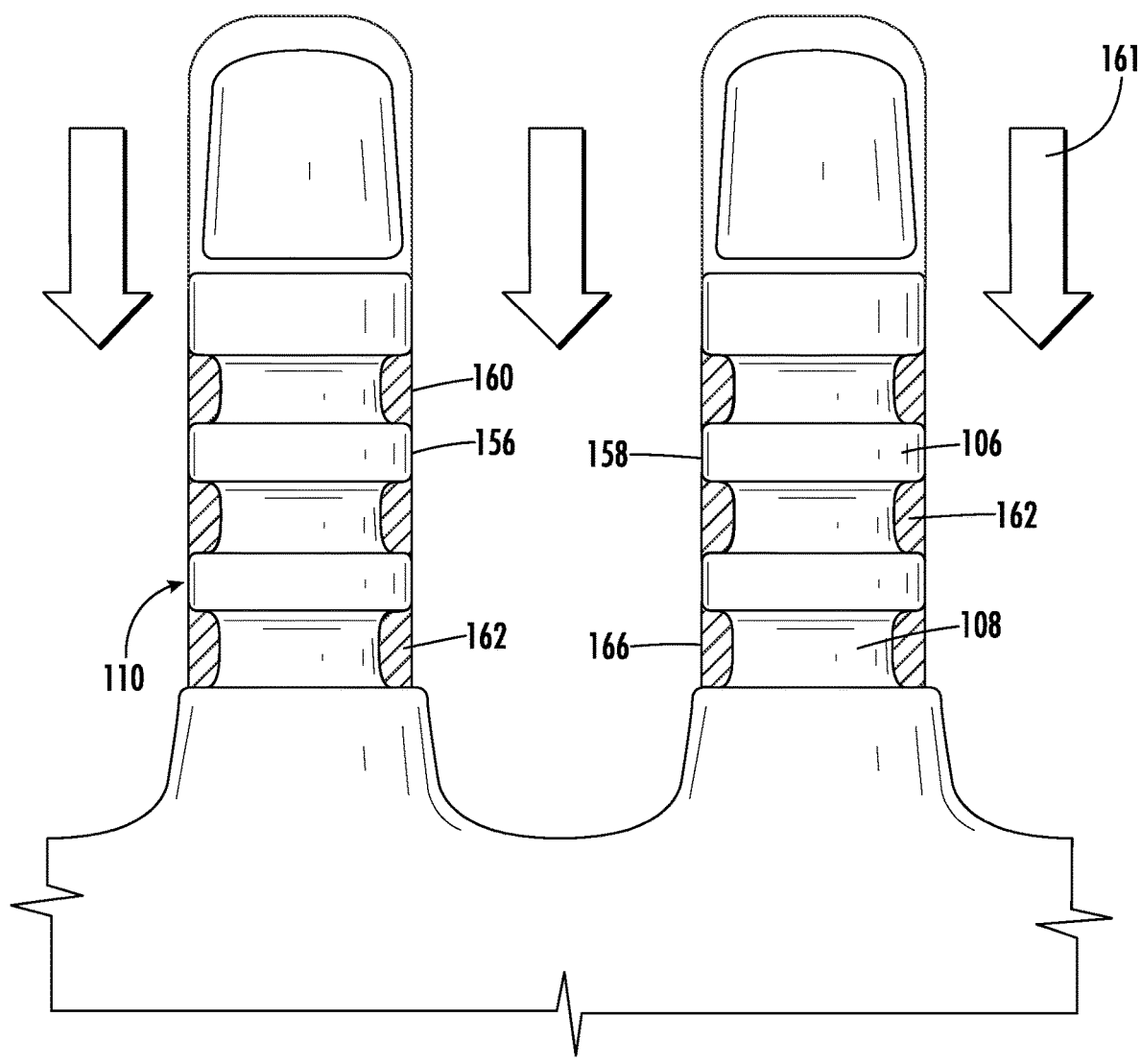
FIG. 11B illustrates a side cross-sectional view of the device following removal of the spacer material from over of the first layer of the pair of nanosheet structures, according to embodiments of the present disclosure.

As shown in FIGS. 11A-11B, the spacer material 160 may then be removed (e.g., etched) selective to the first layers 106. More specifically, an SRP etch 161 may be performed to remove the spacer material 160 from the outer surfaces 156, 158 of the first layers 106. However, the spacer material 160 remains along the second layers 108 of each of the nanosheets 110 to form an inner spacer 162 between each of the first layers 106. As a result of the SRP etch 161, outer surfaces 156, 158 of the first layers 106 are exposed in the trenches 134. In some embodiments, a plane defined by an outer surface 166 of the inner spacer 162 is approximately equal to the plane defined by the outer surfaces 156, 158 of the first layers 106.

Figure 11C:
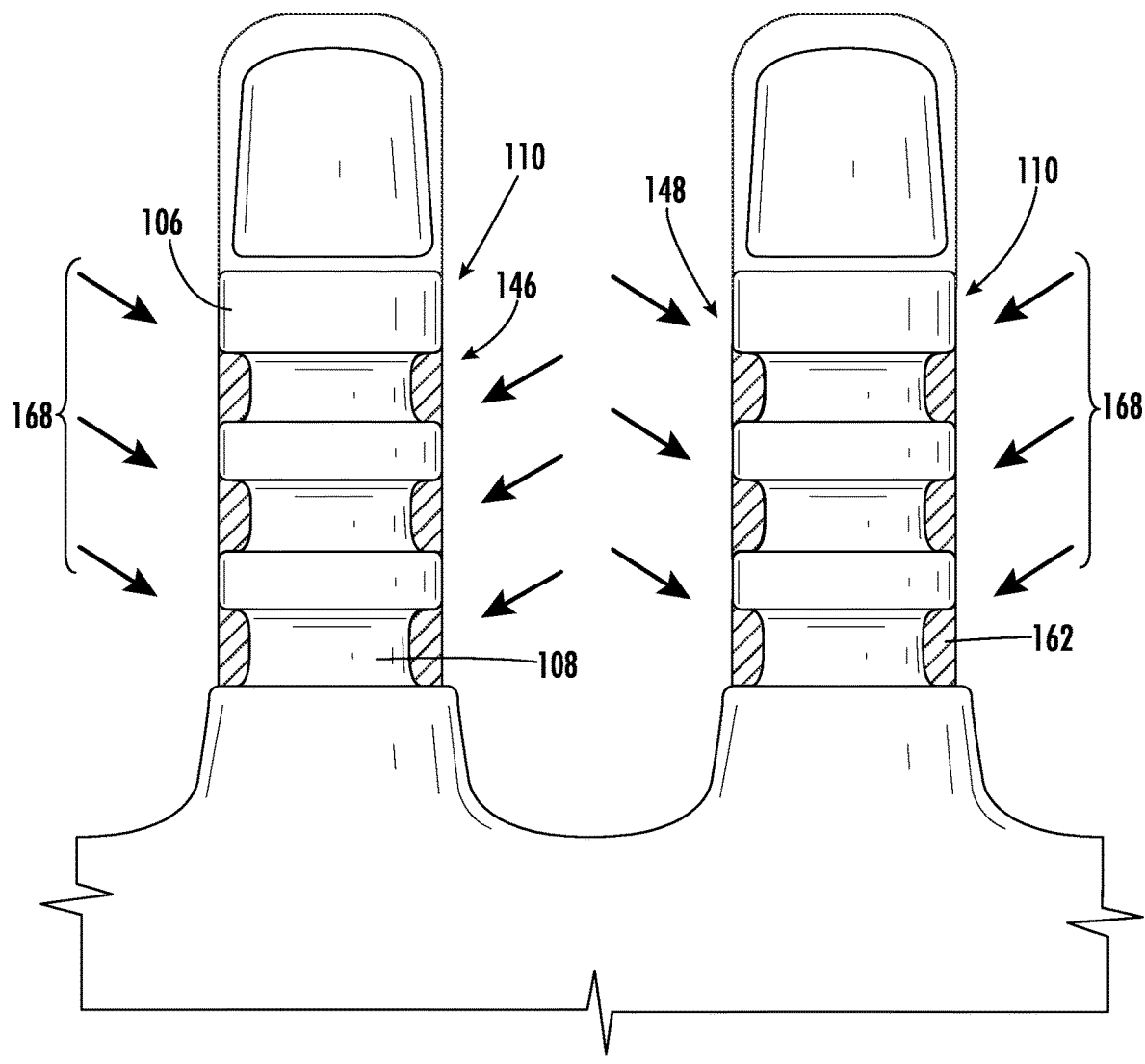
FIG. 11C illustrates a side cross-sectional view of the device during implantation of the pair of nanosheets, according to embodiments of the present disclosure.

As shown in FIG. 11C, a sidewall treatment 168 may be performed to the inner spacer 162 after the spacer material 160 is removed from the first layers 106 of the nanosheets 110. In some embodiments, the sidewall treatment 168 is a plasma treatment (e.g., decoupled plasma treatment (DPX) or plasma doping (PLAD)) impacting the nanosheets 110. In various embodiments, the sidewall treatment 168 may be delivered at an angle into the first sidewall 146 and the second sidewall 148 of the nanosheets 110, as shown, or vertically. Although non-limiting, the sidewall treatment 168 may be plasma treatment including helium, argon, nitrogen, oxygen, and/or hydrogen. The plasma dose may be constant or variable. As a result of the sidewall treatment 168, the inner spacer 162 may be hardened or densified to make the inner spacer 162 more resistant to subsequent device processing, such as etching. When the sidewall treatment 168 includes oxygen, a K value of the inner spacer 162 may be reduced.

Figure 12A:
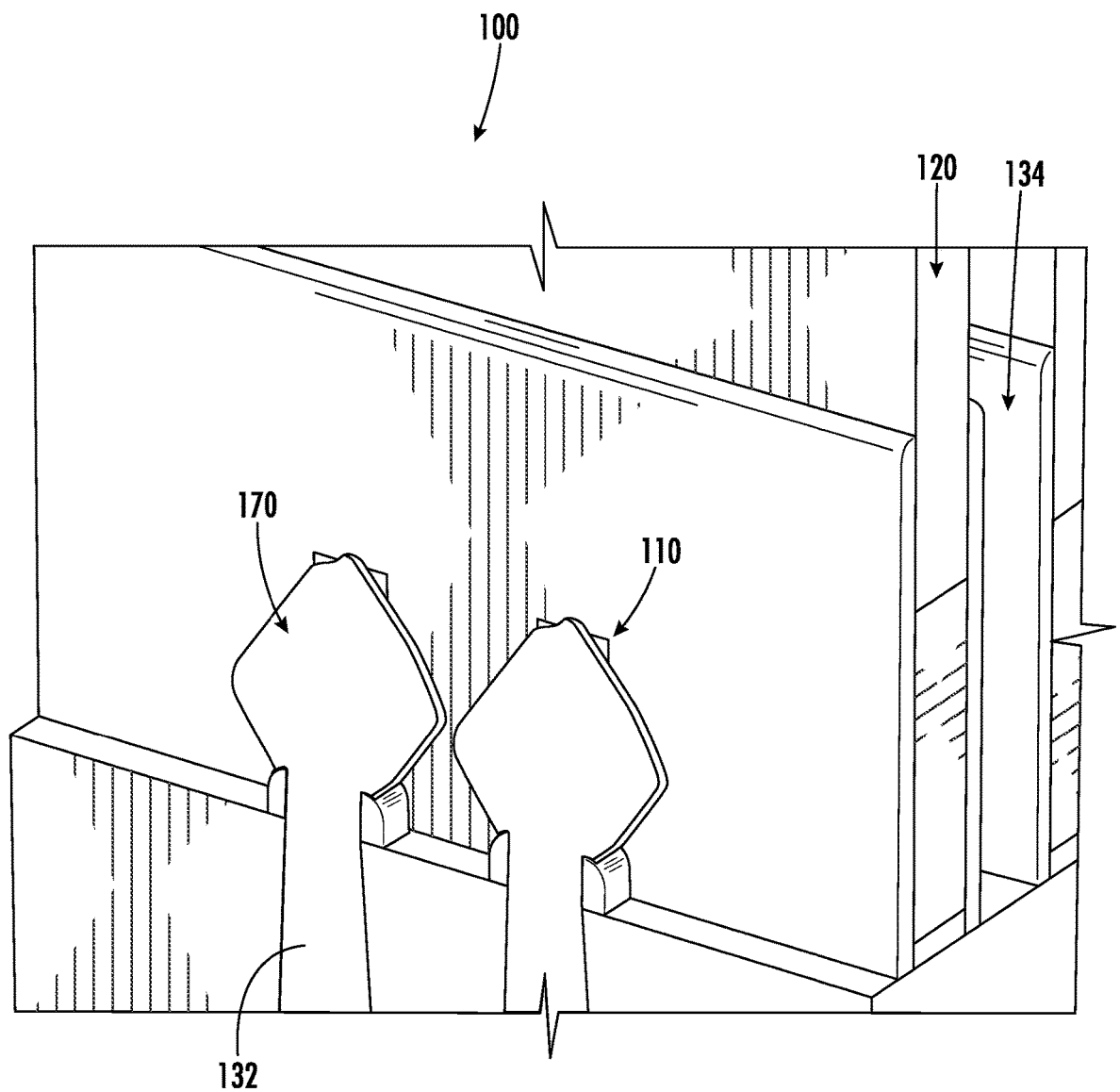
FIG. 12A illustrates a perspective view of the device following formation of a source/drain (S/D) epitaxial layer between the plurality of dummy gate structures, according to embodiments of the present disclosure.
Figure 12B:
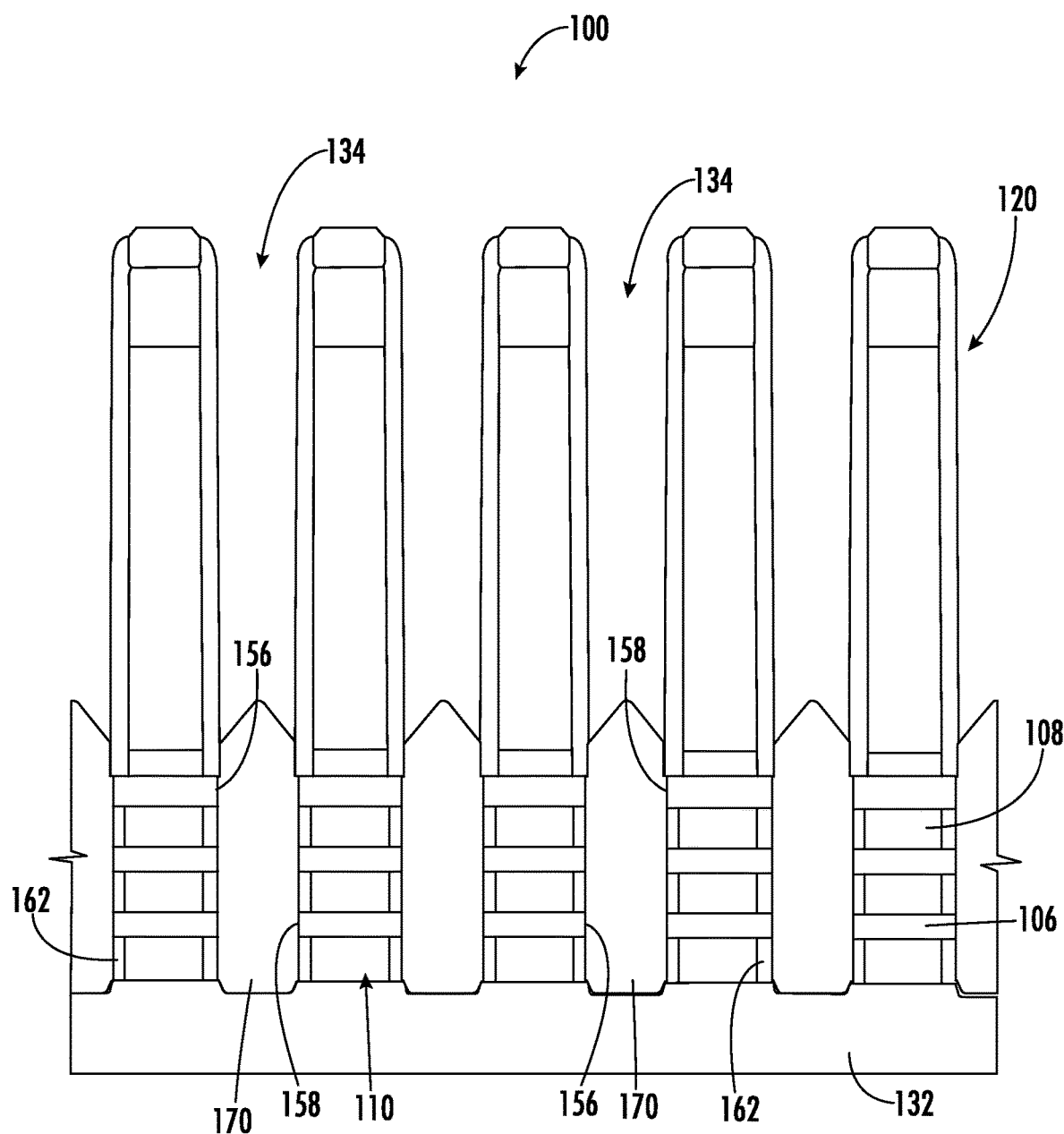
FIG. 12B illustrates a side cross-sectional view of the device following formation of the S/D epitaxial layer between the plurality of dummy gate structures, according to embodiments of the present disclosure.

Next, as shown in FIGS. 12A-12B, a S/D epitaxial region/layer 170 may be formed by selectively growing a semiconductor material in the trenches 134 between each of the plurality of dummy gates 120 and between each of the nanosheets 110. In some embodiments, an epitaxy process may use chemical vapor deposition (CVD) techniques (e.g., vapor phase epitaxy and/or Ultra-High Vacuum CVD), molecular beam epitaxy, other suitable epitaxial growth processes, or combinations thereof, to form the S/D layer 170. The epitaxy process can use gaseous and/or liquid precursors, which interact with the composition of the substrate base 104 (not shown) and the first layers 106 of the nanosheets 110. As best shown in FIG. 12B, the S/D epitaxial layer 170 may be in direct contact with the outer surfaces 156, 158 of the first layers 106 and in direct contact with the inner spacers 162. As further shown, the S/D epitaxial layer 170 may be formed directly atop the silicon portion 132 of the nanosheets 110. In some embodiments, formation of the S/D epitaxial layer 170 may be performed using a cluster tool with SRP, DPX, PLAD, and epitaxial deposition capabilities. The same cluster tool may be used to perform the selective etch back demonstrated in FIGS. 11A-11B as well as the sidewall treatment 168 demonstrated in FIG. 11C. Embodiments are not limited in this context, however.

In some embodiments, the S/D layer 170 may be doped with n-type dopants and/or p-type dopants. Although non-limiting, for n-type transistors, the S/D layer 170 may include silicon and can be doped with carbon, phosphorous, arsenic, other n-type dopant, or combinations thereof (e.g., forming Si:C epitaxial source/drain features, Si:P epitaxial source/drain features, or Si:C:P epitaxial source/drain features). For p-type transistors, the S/D layer 170 may include silicon germanium or germanium, and can be doped with boron, other p-type dopant, or combinations thereof (for example, forming Si:Ge:B epitaxial source/drain features). Further, the doping can be in-situ (i.e., doped during deposition by adding impurities to a source material of the epitaxy process) or ex-situ (e.g., doped by an ion implantation process subsequent to a deposition process). In some embodiments, annealing processes (e.g., rapid thermal annealing (RTA) and/or laser annealing) are performed to activate dopants in the S/D layer 170.

Figure 13:
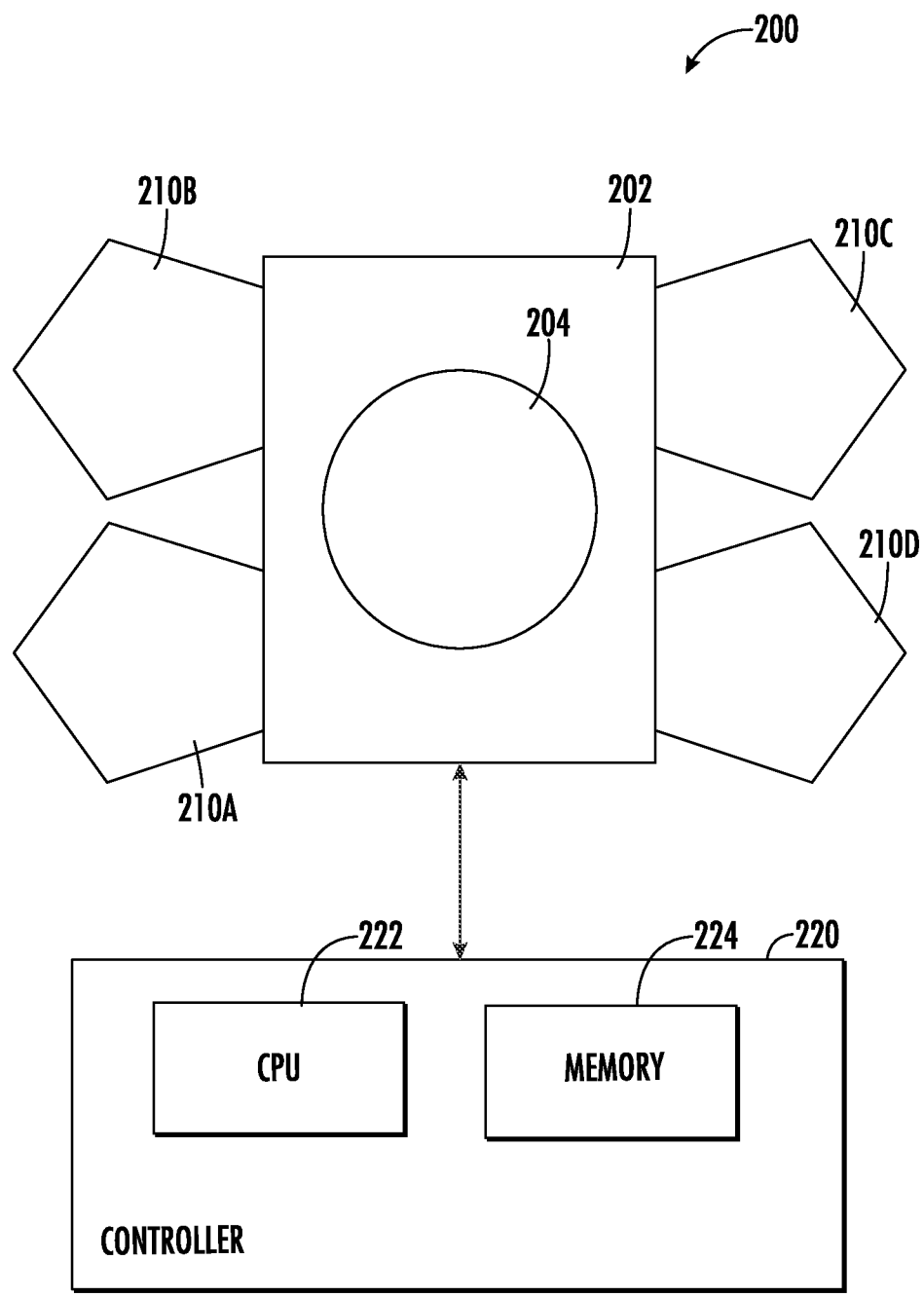
FIG. 13 illustrates a schematic diagram of an example system according to embodiments of the present disclosure.

FIG. 13 shows a schematic of an example system/apparatus 200 according to embodiments of the disclosure. Operation of the system 200 will be described with reference to the device 100. In some embodiments, the system 200 may be a cluster tool operable to perform processes necessary to form the device 100 described herein. Although non-limiting, the system 200 may include at least one central transfer station/chamber 202 and one or more robots 204 within the transfer station/chamber 202, wherein the robot 204 is operable to move a robot blade and a wafer to and from each of a plurality of processing chambers 210A-210D connected with, or positioned adjacent to, the transfer station/chamber 202. In some embodiments, the system 200 may include any variety of suitable chambers including, but not limited to, an etch chamber 210A, a first deposition chamber 210B, a second deposition chamber 210C, and a metrology chamber 210D. The particular arrangement of process chambers and components can be varied depending on the cluster tool, and should not be taken as limiting the scope of the disclosure.

In some embodiments, the etch chamber 210A may be used to remove the exposed portions of the nanosheets 110. As described herein, the plurality of alternating first layers 106 and second layers 108 may be etched within the trenches 134. The etch chamber 210A may be further used to etch the plurality of nanosheets 110 to laterally recess the second layers 108 relative to the first layer 106s. In some embodiments, etching may include removing the second layers 108 relative to the first layers 106 of the nanosheets 110 and relative to the gate spacers 122. In some embodiments, the etch process may be a lateral SiGe etch performed by a SRP device within the etch chamber 210A.

The etch chamber 210A may be further used to etch the spacer material 160 selective to the first layers 106. More specifically, the SRP etch 161 may be performed to remove the spacer material 160 from the outer surfaces 156, 158 of the first layers 106. The spacer material 160 may remain along the second layers 108 of each of the nanosheets 110 to form the inner spacer 162 between each of the first layers 106. As a result of the SRP etch 161, the outer surfaces 156, 158 of the first layers 106 are exposed in the trenches 134.

In some embodiments, the first deposition chamber 210B may be used to form the spacer material 160 along the nanosheets 110. In some embodiments, the spacer material 160 may be a dielectric formed along the various exposed surfaces of the device 100, such as the dummy gate structures 120, the outer surfaces 128 of the gate spacer 122, and the surfaces of the plurality of alternating first layers 106 and second layers 108 exposed in the trenches 134. The first deposition chamber 210B of some embodiments comprises one or more of an atomic layer deposition chamber, a plasma enhanced atomic layer deposition chamber, a chemical vapor deposition chamber, a plasma enhanced chemical vapor deposition chamber, or a physical deposition.

In some embodiments, the second deposition chamber 210C may be used to form the S/D epi region/layer 170 in the trenches 134, between each of the plurality of dummy gates 120 and between each of the nanosheets 110. In some embodiments, an epitaxy process may use chemical vapor deposition, molecular beam epitaxy, or other suitable epitaxial growth processes to form the S/D layer 170. In alternative embodiments, only a single deposition chamber is present in the system 200.

In some embodiments, the metrology chamber 210D may be used during the measurement process 144 together with one or more metrology tools. As described herein, the metrology tool(s) may take a plurality of a distance measurements between the first sidewall 146 and the second sidewall 148 of the nanosheets 110, e.g., between the upper and lower portions 140, 138 thereof, as described herein. The results of the measurements are then fed forward to aid in the various etching processes.

A system controller 220 is in communication with the robot 204, the transfer station/chamber 202, and the plurality of processing chambers 210A-210D. The system controller 220 can be any suitable component that can control the processing chambers 210A-210D and robot(s) 204, as well as the processes occurring within the process chambers 210A-210D. For example, the system controller 220 can be a computer including a central processing unit 222, memory 224, suitable circuits/logic/instructions, and storage.

Processes or instructions may generally be stored in the memory 224 of the system controller 220 as a software routine that, when executed by the processor 222, causes the process chambers 210A-210D to perform processes of the present disclosure. The software routine may also be stored and/or executed by a second processor (not shown) that is remotely located from the hardware being controlled by the processor 222. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 222, transforms the general purpose computer into a specific purpose computer (controller) that controls the chamber operation such that the processes are performed.

Figure 14A:
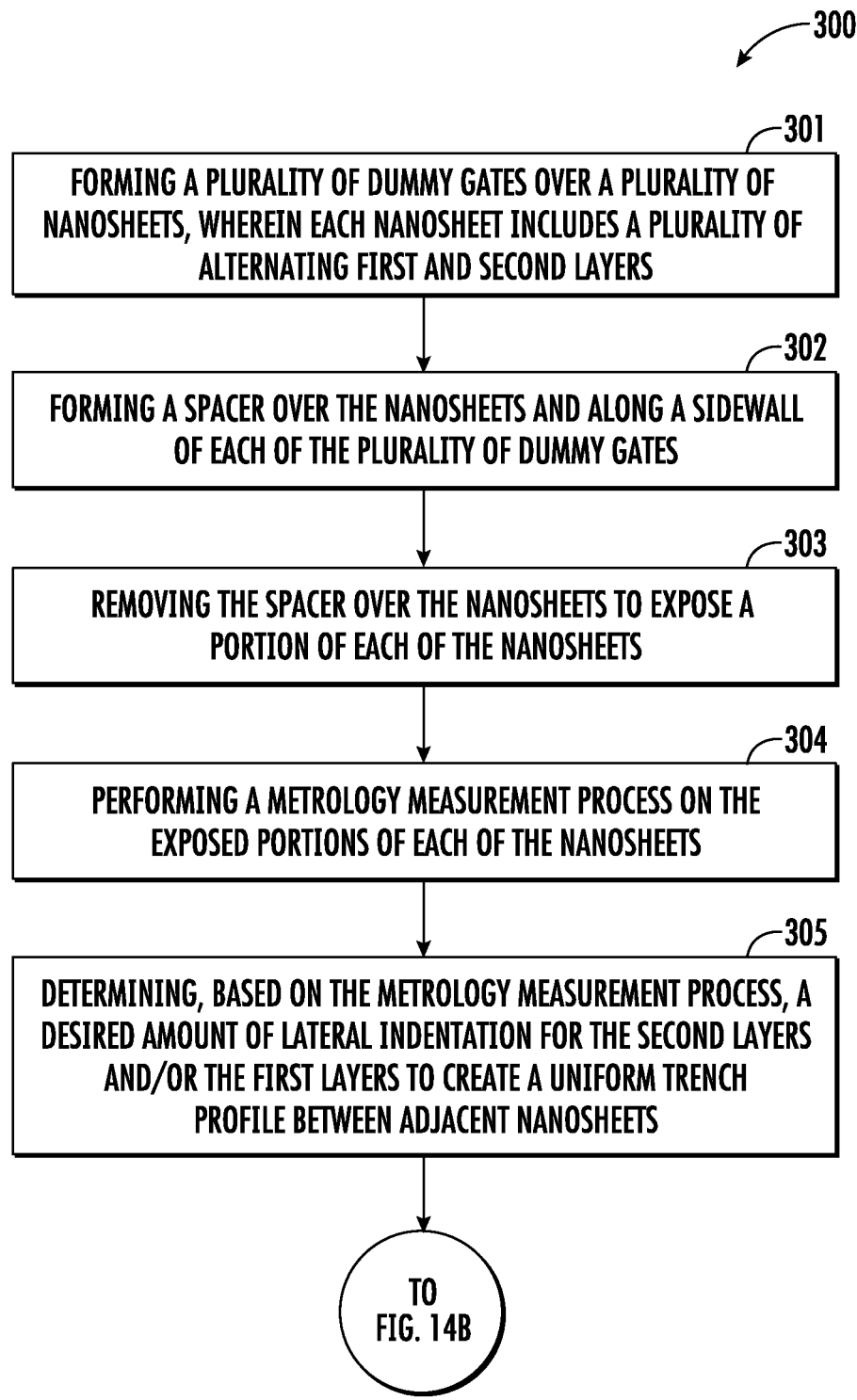
FIGS. 14A-14B depict a process flow of a method for forming the device, according to embodiments of the present disclosure.
Figure 14B:
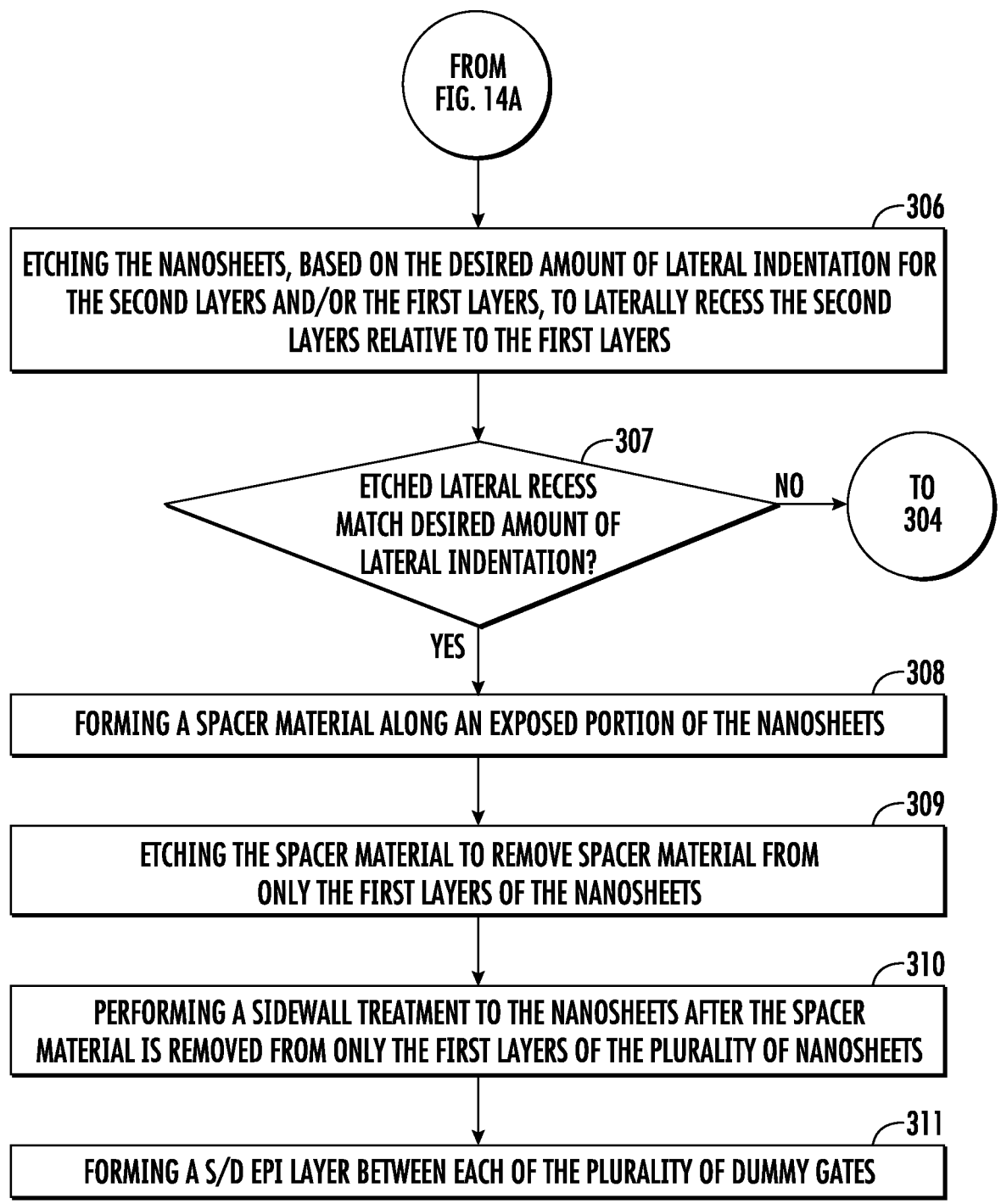

Turning now to FIGS. 14A-14B, a process 300 according to embodiments of the present disclosure is shown. At block 301, the process 300 may include forming a plurality of dummy gates over a plurality of nanosheets, wherein the plurality of nanosheets are formed from a substrate, and wherein each of the plurality of nanosheets comprises a plurality of alternating first layers and second layers. In some embodiments, the first layers include silicon and the second layers include silicon germanium.

At block 302, the process 300 may include forming a spacer over the plurality of nanosheets and along a sidewall of each of the plurality of dummy gates. In some embodiments, the spacer may be a plurality of gate spacers formed over the device, including along a sidewall of each of the dummy gates and over the plurality of alternating first layers and second layers of the nanosheets. The spacer may then be removed, at block 303, to expose the plurality of alternating first layers and second layers. More specifically, the spacer may be removed over the nanosheets to expose a portion of each of the nanosheets.

At block 304, the process 300 may include performing a metrology measurement process on the exposed portion(s) of each of the nanosheets. In some embodiments, the metrology measurement process may include any number of different metrology techniques including, but not limited to, SEM, TEM, CD-SEM and the like. In other embodiments, OCD measurement, AFM, or CD-AFM may be used for measuring gate lengths between the exposed portions of the nanosheets. In some embodiments, the metrology measurement process may occur in a metrology chamber.

At block 305, the process 300 may include determining, based on the metrology measurement process, a desired amount of lateral indentation for the second layers and/or the first layers to create a uniform trench profile between adjacent nanosheets. In some embodiments, various measurement data may be fed forward to an etch device, wherein an etch process/recipe is generated and executed based on the measurement data. In some embodiments, the etch process/recipe may be selected to target the specific material composition (e.g., SiGe) of the second layers, wherein the etch process may include one or multiple etch steps. For example, one or more etch steps may have high etching selectivity tuned to the second layers with substantially no (or minimal) etching loss occurring on the first layers 106.

At block 306, the process 300 may include etching the nanosheets, based on the desired amount of lateral indentation for the second layers and/or the first layers, to laterally recess the second layers relative to the first layers. In some embodiments, the etch process may be a lateral SiGe etch performed by a SRP device+OBM, optimized to indent the second layers to a desired horizontal depth/distance. In some embodiments, one or more layers of the second layers may be recessed more than another one or more layers of the second layers. In some embodiments, a distance between two adjacent nanosheets of the plurality of nanosheets is constant between a lower portion and an upper portion of the plurality of nanosheets.

At block 307, it is determined whether the etched lateral recess matches the desired amount of lateral indentation. If NO, the process returns to block 304. If YES, the process continues to block 308, wherein an inner spacer is then formed over the recessed second layers. More specifically, at block 308, the process 300 may include forming a spacer material along the exposed portion of each of the plurality of nanosheets. In some embodiments, the spacer material may be formed using either a FCV deposition or ALD deposition process.

At block 309, the process may include etching the spacer material to remove the spacer material from only the first layers of each of the plurality of nanosheets. The spacer material may remain along the second layers of each of the plurality of nanosheets to form the inner spacer. In some embodiments, an additional metrology measurement process may be performed to verify a uniform distance between the spacer material formed on adjacent nanosheets. If necessary, the process may return to block 308 for additional spacer material deposition.

At block 310, the process 300 may include performing a sidewall treatment to the nanosheets after the spacer material is removed from only the first layers of the plurality of nanosheets. In some embodiments, the plasma treatment may be a decoupled plasma treatment or a PLAD ion implant.

At block 311, the process 300 may include forming a S/D epi layer between each of the plurality of dummy gates. In some embodiments, S/D epi layer may be in direct contact with outer surfaces of the first layers of the nanosheets 110 and in direct contact with the inner spacers. In some embodiments, formation of the S/D epi layer may be performed using a cluster tool with SRP, DPX, PLAD, and epitaxial deposition capabilities.

Although not described in detail herein, processing of the device 100 may continue by, e.g., forming a contact etch stop layer (CESL) and an inter-level dielectric (ILD) layer over the device 100, followed by removal of the dummy gate structures 120 from the device 100 to form gate trenches.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, the substrate base 104 may be silicon, such as a silicon wafer. Alternatively, or additionally, substrate base 104 may includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate base 104 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate base 104 can include various doped regions depending on design requirements of the device 100. For example, the substrate base 104 may include p-type doped regions configured for n-type GAA transistors and n-type doped regions configured for p-type GAA transistors. P-type doped regions are doped with p-type dopants, such as boron, indium, other p-type dopant, or combinations thereof. N-type doped regions are doped with n-type dopants, such as phosphorus, arsenic, other n-type dopant, or combinations thereof. In some implementations, the substrate base 104 includes doped regions formed with a combination of p-type dopants and n-type dopants. The various doped regions can be formed directly on and/or in the substrate base 104, for example, providing a p-well structure, an n-well structure, a dual-well structure, a raised structure, or combinations thereof. An ion implantation process, a diffusion process, and/or other suitable doping process can be performed to form the various doped regions.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   forming a plurality of nanosheets each comprising an upper surface and a set of opposing sidewall surfaces, wherein the plurality of nanosheets each further comprise a plurality of alternating first layers and second layers, and wherein a distance between two adjacent nanosheets of the plurality of nanosheets varies between a lower portion and an upper portion of the two adjacent nanosheets;
   etching the plurality of nanosheets to laterally recess the second layers relative to the first layers, wherein the distance between the two adjacent nanosheets of the plurality of nanosheets is constant between the lower portion and the upper portion of the two adjacent nanosheets following the etching; and forming an inner spacer over the recessed second layers by:
- forming a spacer material along an exposed portion of each of the plurality of nanosheets;
- etching the spacer material to remove the spacer material from the first layers of each of the plurality of nanosheets; and
- performing a sidewall treatment to the plurality of nanosheets after the spacer material is removed from the first layers of each of the plurality of nanosheets.

2. The method of claim 1, wherein forming the spacer material along the exposed portion of each of the plurality of nanosheets comprises one of the following: a flowable chemical vapor deposition or an atomic layer deposition.

3. The method of claim 1, wherein the sidewall treatment is a decoupled plasma treatment or a plasma doping ion implant.

4. The method of claim 1, further comprising:
- forming a plurality of dummy gates over the plurality of nanosheets, wherein the plurality of nanosheets are formed from a substrate;
- forming a spacer over the plurality of nanosheets and along a sidewall of each of the plurality of dummy gates; and
- removing the spacer over the plurality of nanosheets to expose the portion of each of the plurality of nanosheets.

5. The method of claim 4, further comprising forming a source/drain epitaxial layer between each of the plurality of dummy gates.

6. The method of claim 1, further comprising performing a measurement process to determine a desired amount of lateral indentation for the second layers.

7. The method of claim 6, wherein etching the plurality of nanosheets to laterally recess the second layers relative to the first layers comprises performing a lateral etch based on the desired amount of lateral indentation determined for the second layers.

8. A system, comprising:
a processor;
a memory storing instructions executable by the processor to:
- form a plurality of nanosheets each comprising a plurality of alternating first layers and second layers, and an upper surface and a set of opposing sidewall surfaces, wherein a distance between two adjacent nanosheets of the plurality of nanosheets varies between a lower portion and an upper portion of the two adjacent nanosheets;
- etch the plurality of nanosheets to laterally recess the second layers relative to the first layers, wherein the distance between the two adjacent nanosheets of the plurality of nanosheets is constant between the lower portion and the upper portion of the two adjacent nanosheets following the etch; and
- form an inner spacer over the recessed second layers by:
  - forming a spacer material along an exposed portion of each of the plurality of nanosheets;
  - etching the spacer material to remove the spacer material from the first layers of each of the plurality of nanosheets; and
  - performing a sidewall treatment to the plurality of nanosheets after the spacer material is removed from the first layers of each of the plurality of nanosheets.

9. The system of claim 8, wherein the instructions executable by the processor to form the spacer material along the exposed portion of each of the plurality of nanosheets comprise performing one of the following: a flowable chemical vapor deposition or an atomic layer deposition.

10. The system of claim 8, wherein the sidewall treatment is a decoupled plasma treatment or a plasma doping ion implant.

11. The system of claim 8, the memory storing further instructions executable by the processor to:
- form a plurality of dummy gates over the plurality of nanosheets, wherein the plurality of nanosheets are formed from a substrate;
- form a spacer over the plurality of nanosheets and along a sidewall of each of the plurality of dummy gates; and
- remove the spacer over the plurality of nanosheets to expose the portion of each of the plurality of nanosheets.

12. The system of claim 11, the memory storing further instructions executable by the processor to form a source/drain epitaxial layer between each of the plurality of dummy gates.

13. The system of claim 8, the memory storing further instructions executable by the processor to perform a measurement process to determine a desired amount of lateral indentation for the second layers.

14. The method of claim 13, wherein the instructions executable by the processor to etch the plurality of nanosheets to laterally recess the second layers relative to the first layers further comprise performing a lateral etch based on the desired amount of lateral indentation determined for the second layers.

* * * * *